United States Patent
Fang et al.

(10) Patent No.: US 6,933,171 B2
(45) Date of Patent: Aug. 23, 2005

(54) LARGE BUMPS FOR OPTICAL FLIP CHIPS

(75) Inventors: Ming Fang, Portland, OR (US); Valery Dubin, Portland, OR (US); Daoqiang Lu, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/691,136

(22) Filed: Oct. 21, 2003

(65) Prior Publication Data

US 2005/0082551 A1 Apr. 21, 2005

(51) Int. Cl.[7] .................. H01L 21/44; H01L 21/48; H01L 21/50; H01L 23/48; H01L 23/52
(52) U.S. Cl. .................. 438/108; 257/778; 228/180.22
(58) Field of Search .................. 438/108; 257/778; 228/180.22

(56) References Cited

U.S. PATENT DOCUMENTS

| | | | | |
|---|---|---|---|---|
| 5,059,553 | A | * | 10/1991 | Berndlmaier et al. ........ 438/614 |
| 5,394,490 | A | * | 2/1995 | Kato et al. .................... 385/14 |
| 5,672,542 | A | * | 9/1997 | Schwiebert et al. ............ 438/4 |
| 5,770,477 | A | * | 6/1998 | Brandenburg ............... 438/108 |
| 6,566,239 | B2 | * | 5/2003 | Makino et al. ............. 438/612 |
| 2001/0018230 | A1 | * | 8/2001 | Jimarez et al. ............. 438/108 |
| 2003/0206680 | A1 | * | 11/2003 | Bakir et al. .................. 385/14 |
| 2004/0070080 | A1 | * | 4/2004 | Pendse ....................... 257/778 |

* cited by examiner

Primary Examiner—Craig A. Thompson
Assistant Examiner—Nema Berezny
(74) Attorney, Agent, or Firm—Blakely, Sokoloff, Taylor & Zafman LLP (57) ABSTRACT

The invention provides bumps between a die and a substrate with a height greater than or equal to a height of a waveguide between the die and the substrate. The bumps may be formed on a die prior to that die being singulated from a wafer.

26 Claims, 7 Drawing Sheets

LARGE BUMPS FOR OPTICAL FLIP CHIPS

BACKGROUND

1. Field of the Invention

This invention relates to optical flip chips, and more particularly to large bumps between a die and a substrate with a height greater than or equal to a height of a waveguide between the die and substrate.

2. Background of the Invention

Figure 1:
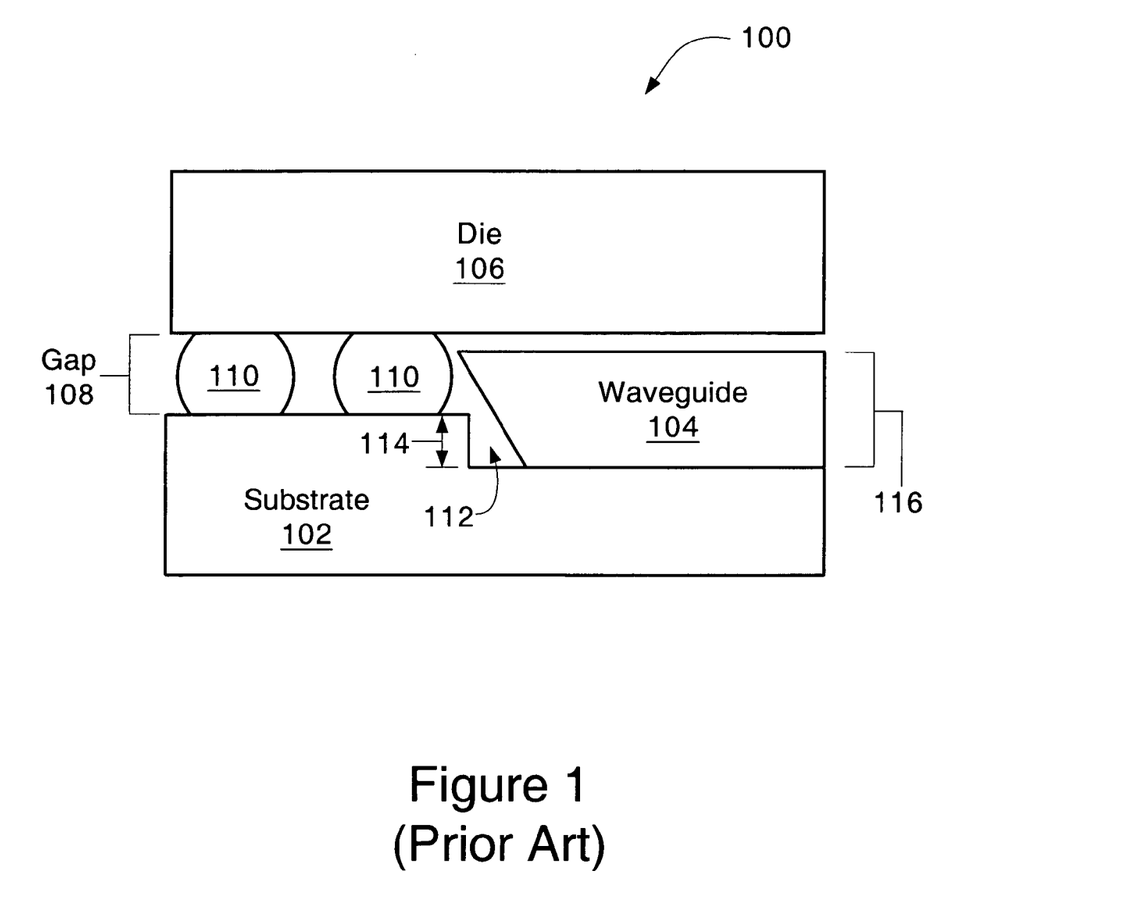
FIG. 1 is a side cross sectional view of an optical device assembly.

FIG. 1 is a side cross sectional view of an optical device assembly 100. There is a substrate 102 connected to a die 106 by conductive bumps 110. The conductive bumps 110 are gold and formed by a wire bonder. To form the conductive bumps 110, gold wire is first attached to the die 106 under ultrasonic power, heat and force, then the wire is flattened to form the bumps 110. There is a gap 108 between the substrate 102 and the die 106. The height of the gap 108 is defined by the height of the bumps 110 that connect the substrate 102 to the die 106 and separate the substrate 102 and die 106 to create the gap 108. The gap 108, and thus the height of the bumps 110, is about 70 micrometers or less.

There is a waveguide 104 between the substrate 102 and the die 106. The waveguide 104 has a height 116 of about 100 micrometers or more. Since the gap 108 between the substrate 102 and die 106 is about 70 micrometers or less, and the height 116 of the waveguide 104 is about 100 micrometers or more, there is a trench 112 in the substrate 102 in which the waveguide 104 is located. The trench 112 is a cavity that extends below the top surface of the substrate 102. The trench 112 has a depth 114 deep enough so that the depth 114 of the trench 112 plus the height of the conductors 110 is greater than or equal to the height 116 of the waveguide 104. This trench 112 allows the waveguide 104 to fit between the substrate 102 and die 106 even though the gap 108 between the substrate 102 and die 106 is not as large as the waveguide 104.

DETAILED DESCRIPTION

Figure 2:
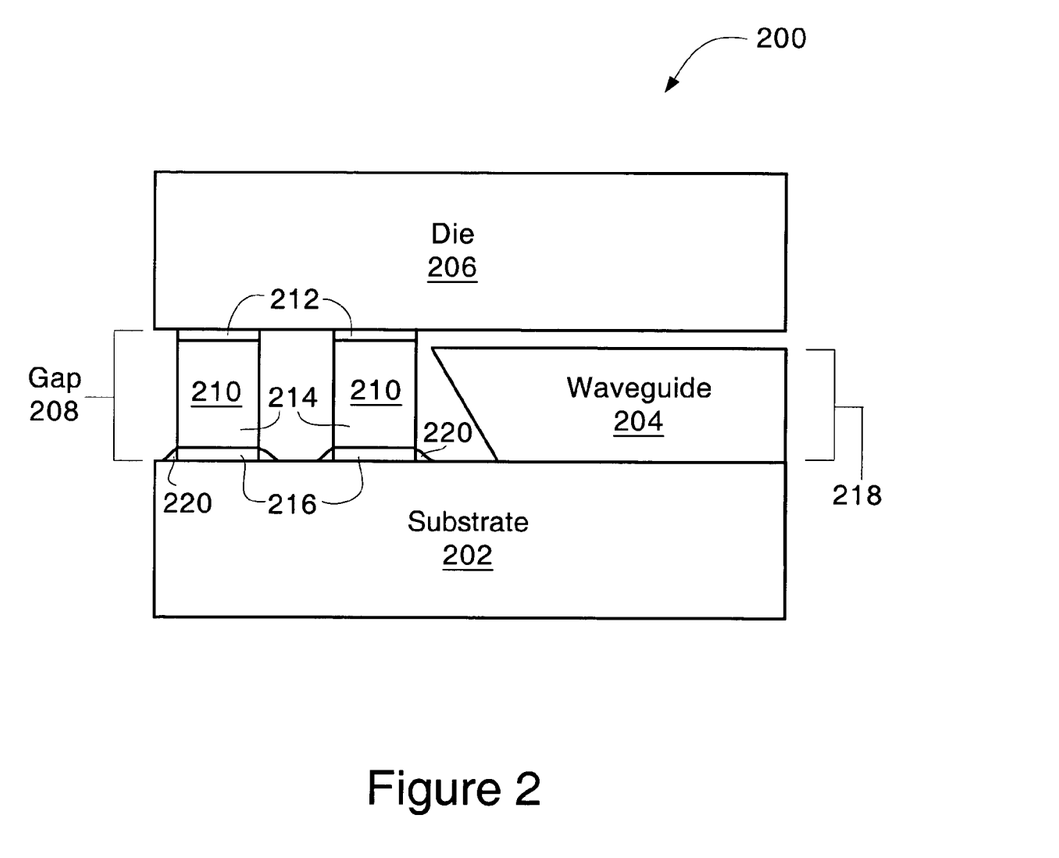
FIG. 2 is a side cross sectional view of an optical device assembly.

FIG. 2 is a side cross sectional view of an optical device assembly 200 according to one embodiment of the present invention. There may be a substrate 202 connected to a die 206 by conductive bumps 210. There may be a gap 208 between the substrate 202 and the die 206. The height of the gap 208 may be defined by the height of the bumps 210 that connect the substrate 202 to the die 206 and separate the substrate 202 and the die 206 to create the gap 208.

The conductive bumps 210 may include one or more layers. In an embodiment, the conductive bumps 210 may include a first conductive layer 212, a second conductive layer 214, and a protection layer 216. In other embodiments, the bumps 210 may include only a subset of the layers 212, 214, and 216, or may include other layers in addition to or in place of the layers illustrated. In an embodiment, the bumps 210 may be formed on the die 206. Solder 220 may then bond the bumps 210 to the substrate 202 to connect the die 206 to the substrate 202, or other methods of bonding may be used. The bumps 210 may comprise materials that do not melt at a temperature at which the bumps 210 are bonded to the substrate 202. In an embodiment, the bumps 210 may comprise materials that have a melting point at a temperature above about 230 degrees Celsius. In an embodiment, the bumps 210 may have a height greater than 75 micrometers. In another embodiment, the bumps 210 may have a height greater than 90 micrometers. In another embodiment, the bumps 210 may have a height in a range of about 95 micrometers to about 120 micrometers.

There may be a waveguide 204 between the substrate 202 and the die 206. The waveguide 204 may have a core for carrying optical signals and structural material. The core may have a height of about 35 micrometers or more. The waveguide 204 may be glued to the substrate 202, integrated with the substrate 202, or held in place by other methods. The waveguide 204 may have a total height 218 of about 95 to 110 micrometers in an embodiment. In another embodiment, the waveguide 204 may have a height 218 greater than about 100 micrometers. The illustrated substrate 202 does not include a trench in which the waveguide 204 is placed. The bumps 210 may have a height large enough for the waveguide 204 to fit in the gap 208 between the die 206 and substrate 206 without use of a trench in the substrate 202. The bumps 210 may thus have a height greater than or equal to the height 218 of the waveguide 204.

FIGS. 3a through 3g are side cross sectional views that illustrate how the bumps 210 may be formed according to one embodiment of the present invention. While only one formed bump 210 is illustrated in FIGS. 3a through 3g, many bumps 210 may be formed at once using the disclosed methods. In an embodiment, the bumps 210 may be formed on a die 206. When the bumps 210 are formed, the die 206 may be one of many that have been fabricated on a wafer. In various embodiments, the bumps 210 may be formed on each die 206 of the wafer prior to singulation, or may be formed on a die 206 after that die 206 has been singulated to separate it from the wafer.

Figure 3A:
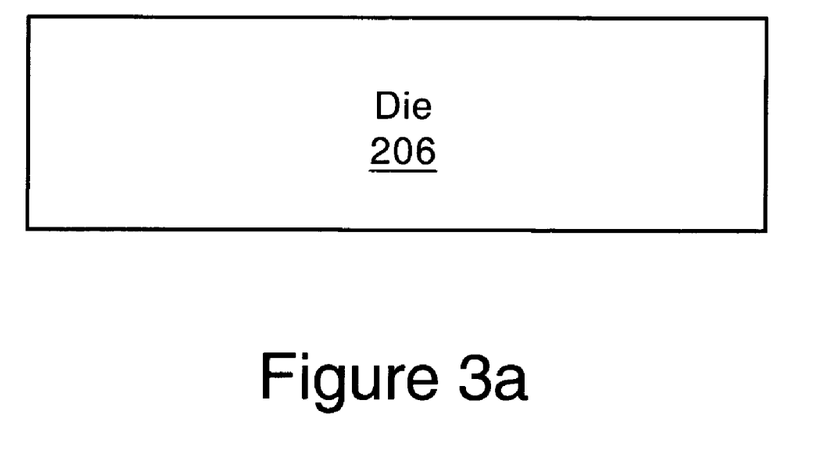
FIGS. 3a through 3g are side cross sectional views that illustrate how bumps may be formed according to one embodiment of the present invention.

FIG. 3a illustrates an optical die 206 on which the bumps 210 may be formed. The die 206 may be any layer generated, such as when making an integrated circuit. The die 206 thus may comprise, for example, active and passive devices that are formed on a wafer, such as transistors, capacitors, resistors, diffused junctions, gate electrodes, local interconnects, or other structures. The wafer may be made of gallium arsenide, gallium nitride, silicon germanium, silicon or other materials. The die 206 may also comprise insulating materials (e.g., silicon dioxide, either undoped or doped with phosphorus or boron and phosphorus; silicon nitride; silicon oxynitride; or a polymer), and may comprise other formed materials.

Figure 3B:
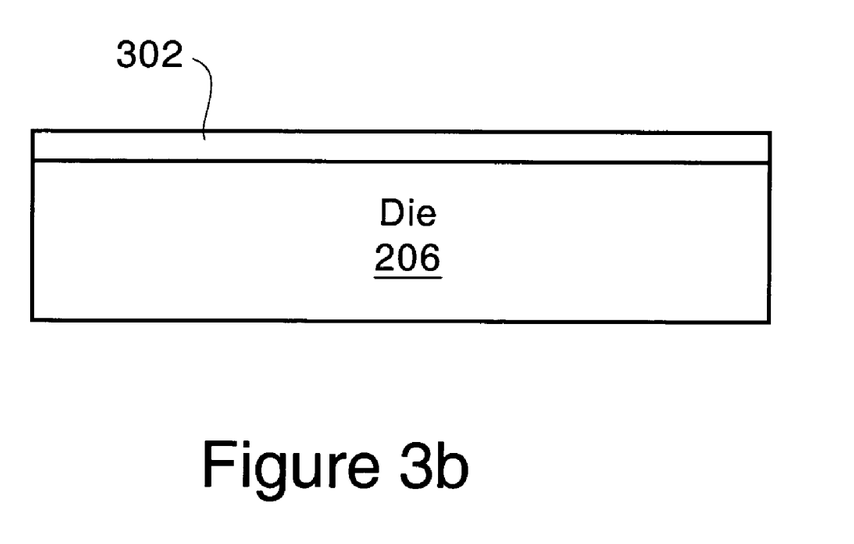

FIG. 3b illustrates a thin conductive layer 302 that may be deposited on the die 206 in an embodiment. Conductive layer 302 may include adhesion and seed layers. The adhesion layer may comprise one or more of Ti, TiN, Cr, Ta, or other materials. There may be a seed layer on top of the adhesion layer. The seed layer may comprise of one or more of Ni, NiV, Co, Cu, Au, and Ag. In various embodiments, the conductive layer 302 may be deposited by physical vapor deposition ("PVD"), chemical vapor deposition ("CVD"), atomic layer deposition ("ALD"), electroless plating, or other methods or combinations of methods. The conductive layer 302 may have a thickness in a range of about 10–10000 nm in an embodiment. The thicknesses of the adhesion layer and the seed layer may be related by a ratio in a range of about 1:1 to about 1:1000. In other words, the seed layer may have a thickness ranging from about equal to the thickness of the adhesion layer to about 1000 times as thick as the adhesion layer.

Figure 3C:
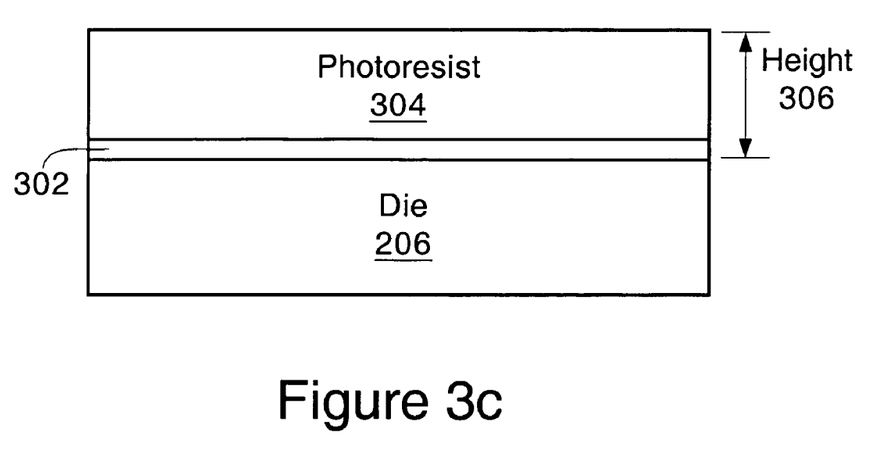

FIG. 3c illustrates a layer of photoresist 304 or other mask material that may be deposited on the seed layer 302 in an embodiment. In an embodiment, a layer of a polymer such as polyamide may be deposited with a hard mask material, such as V, TiN or another metal, or $SiO_2$, SiN or another dielectric material, followed by a layer of photoresist. The term "photoresist 304" therefore refers to any such mask layer. The photoresist 304 layer plus the seed layer 302 may have a combined height 306 that is equal to or greater than the desired height of the bumps 210. This height 306 may be in a range from about 100 micrometers to about 120 micrometers in an embodiment.

Figure 3D:
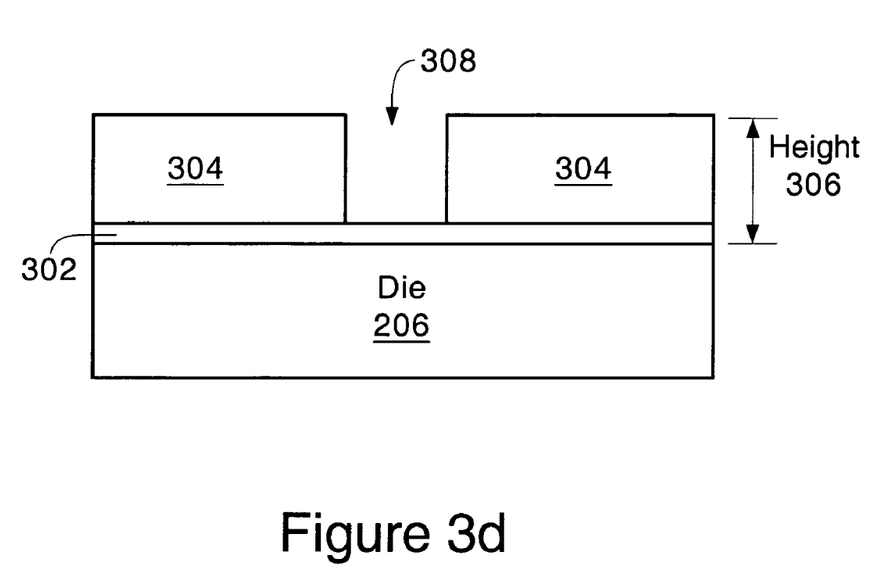

FIG. 3d illustrates how the photoresist 304 may be patterned according to one embodiment. One or more pad openings 308 may be formed in the photoresist 304 by the patterning process. Each pad opening 308 may allow formation and position of a bump 210, so the number of desired bumps 210 may determine how many pad openings 308 are formed. Each pad opening 308 may also determine the position and size of a bump 210. The pad openings 308 may have a substantially circular cross section, with a diameter of about 100 micrometers in one embodiment, although the pad openings 308 may also have other cross sectional shapes and sizes.

Figure 3E:
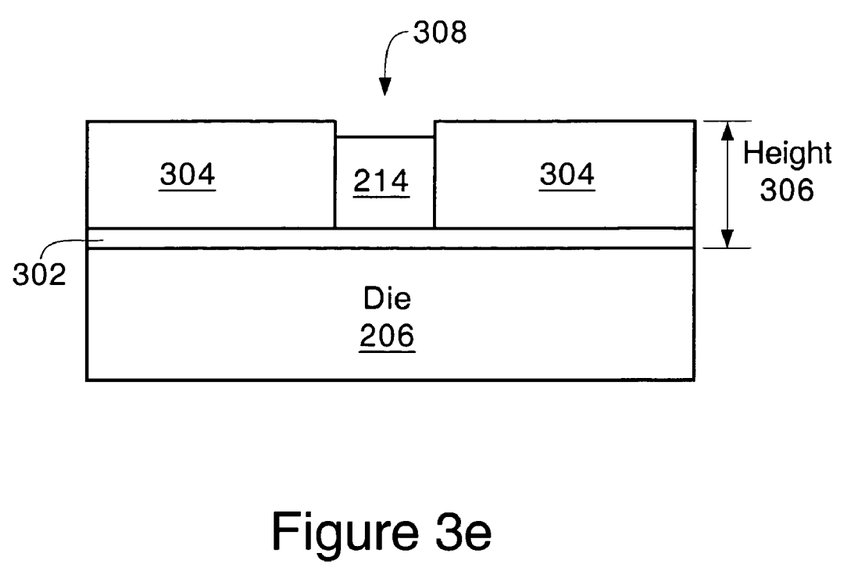

FIG. 3e illustrates a second conductive layer 214 that may be deposited in the pad openings 308. The second conductive layer 214 may have a thickness in a range from about 70 micrometers to about 120 micrometers in some embodiments. The second conductive layer 214 may comprise one or more of Cu, Ni, Co, Fe, Au, Ag, or other materials or combinations of materials. In an embodiment, the second conductive layer 214 may be deposited by electroplating, although other methods may also be used.

Figure 3F:
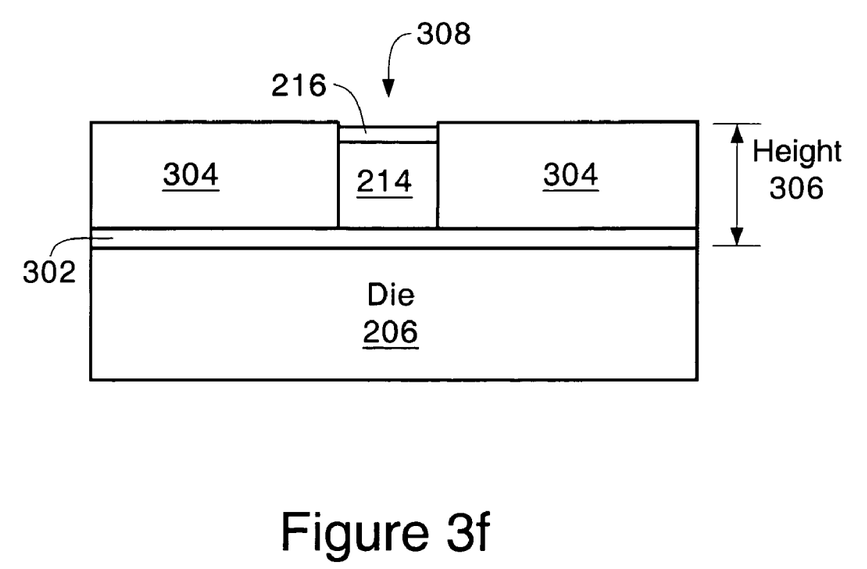

FIG. 3f illustrates a protection layer 216 that may be deposited on the second conductive layer 214. The protection layer 216 may have a thickness in a range from about 10 nanometers to about 3000 nanometers in some embodiments. The protection layer 216 may comprise a noble metal, such as Au, Pt, Pd, Ag, Ir, Os, Ru, Rh, or other materials or combinations of materials. The protection layer 216 may also comprise refractory metals, such as one or more of Re, W, Mo, Ni, Co or other materials or combinations of materials. In various embodiments, the protection layer 216 may be deposited by electroless plating, electroplating, immersion plating or another method. In an embodiment, a protection layer 216 comprising noble metals may be deposited by electroless plating with a solution containing a metal salt of a noble metal, a complexing agent such as citric acid, EDTA, malonic acid, or others, and a reducing agent such as hypophosphite, borohydrate, hydrazine, formaldehyde, or others. In an embodiment, a protection layer 216 may be deposited by immersion plating with a solution containing a salt of a material that will comprise the protection layer 216 and a support electrolyte such as $H_2SO_4$ or HCl acids or other materials. In an alternate embodiment, no protection layer 216 may be deposited at this point in the process. The bump 210 may not include a protection layer 216 in an embodiment. In another embodiment, the protection layer 216 may be deposited at a different point in the process of forming the bumps 210.

In another embodiment, a diffusion barrier layer (not shown) may be deposited between the second conductive layer 214 and the protection layer 216. Such a barrier layer may be deposited on the second conductive layer 214, and then the protection layer 216 may be deposited on the barrier layer. The barrier layer may comprise a material such as one or more of Ni, Co, Re, W, Mo, P, or B. The barrier layer may be deposited by such methods as electroless plating or electroplating. The barrier layer may prevent the diffusion of materials in one of the second conductive layer 214 and the protection layer 216 from diffusing into the other.

Figure 3G:
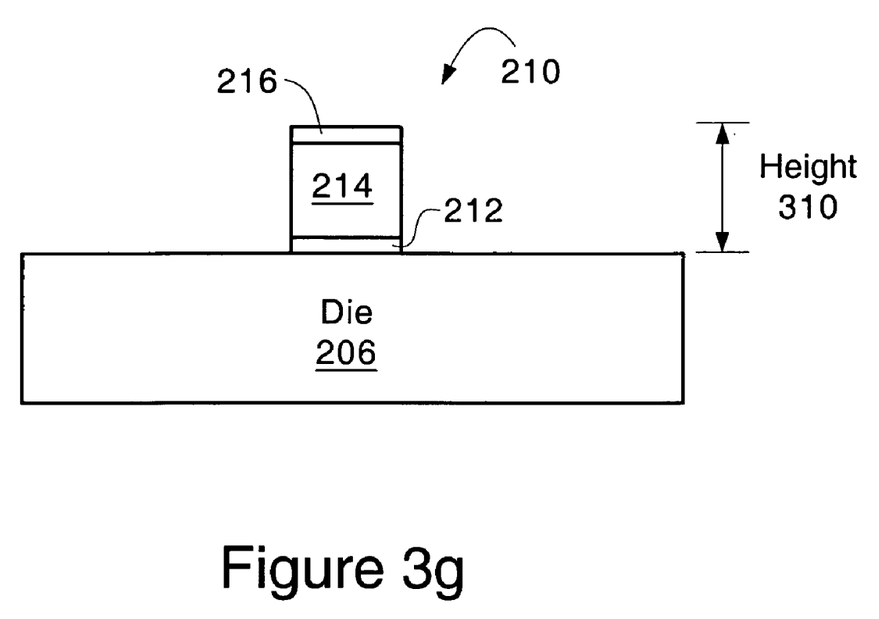

FIG. 3g illustrates a completed bump 210 that may be formed by an embodiment of the present invention. The photoresist layer 304 may be removed by methods such as a stripping process. The thin layer 302 may be partially removed by methods such as etching with an acid solution containing $H_2SO_4$ or HCl or other methods to leave behind the first conductive layer 212. The removal of the photoresist layer 304 and the seed layer 302 may result in a bump 210 with a height 310 equal to the combined heights of the layers that make up the bump 210, which may be the first conductive layer 212, second conductive layer 214 and protection layer 216 in an embodiment. As described above, the bump 210 height 310 may be greater than 75 micrometers, greater than 90 micrometers, in a range of about 95 micrometers to about 120 micrometers, or another height. The height 310 may be equal to or greater than a height 218 of a waveguide 204 that will be located between the die 206 and a substrate 202, so that no trench may be required to fit the waveguide 204 between the die 206 and the substrate 202.

In some embodiments where the protection layer 216 may not have been deposited previously, a protection layer 216 may be deposited after photoresist removal and thin conductive layer 302 removal. In such embodiments, the protection layer 216 may be deposited by selective electroless or immersion plating and may form a layer at least partially covering the sides of the bump 210 as well as the top.

Figure 4:
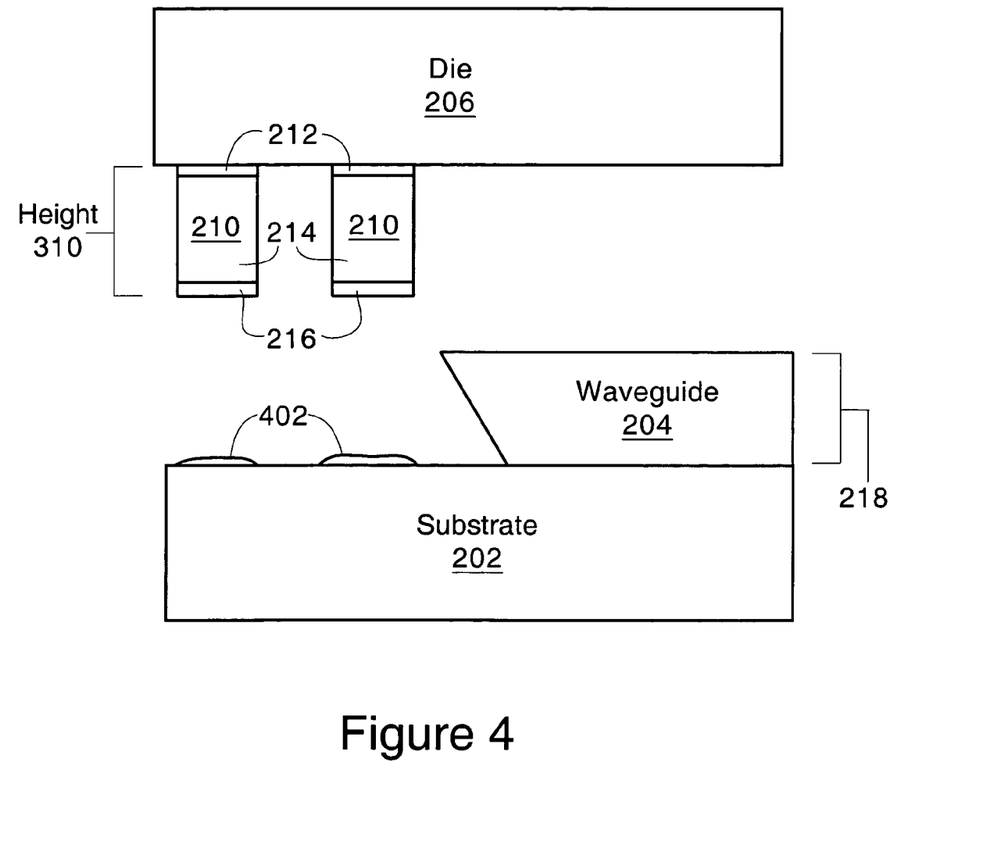
FIG. 4 is a side cross sectional view illustrating how the die may be bonded to the substrate according to one embodiment of the present invention.

FIG. 4 is a side cross sectional view illustrating how the die 206 may be bonded to the substrate 202 according to one embodiment of the present invention. There may be solder pads 402 on the substrate 202. The die 206 and substrate 202 may be pressed together and the solder pads 402 heated to bond the bumps 210 to the substrate 202. The protection layer 216 may protect the second conductive layer 214 to allow fluxless solder bonding of the bump 210 to the substrate 202. In an embodiment where the bump 210 lacks a protection layer 216, flux may be used when bonding the bump 210 to the substrate 202. The bumps 210 may comprise materials that do not melt at a temperature at which the bumps 210 are bonded to the substrate 202, such as a temperature at which the solder pads 402 melt. Note that the waveguide 204 may be in front of or behind the bumps 210 so that the bumps 210 may contact the substrate 202 rather than being blocked by the waveguide 204. As the height 310 of the bumps 210 may be greater than or equal to the height 218 of the waveguide 204, the die 206 may be bonded to the substrate 202 without locating the waveguide 204 in a trench on the substrate 202 or die 206 to provide enough clearance.

The foregoing description of the embodiments of the invention has been presented for the purposes of illustration and description. It is not intended to be exhaustive or to limit the invention to the precise forms disclosed. This description and the claims following include terms, such as left, right, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method, comprising:
   forming a die with a surface;
   forming conductive bumps on the surface of the die, the conductive bumps having a height equal or greater than the height of a waveguide, wherein forming conductive bumps comprises:
      depositing a mask material layer on the die;
      patterning the mask material layer to form pad openings;
      depositing a second conductive layer in the pad openings of the patterned mask; and
      removing the mask material;
   forming a substrate; and
   bonding the conductive bumps to the substrate.

2. The method of claim 1, wherein the waveguide has a height in a range of about 95 micrometers to about 110 micrometers.

3. The method of claim 1, wherein the conductive bumps have a height greater than about 80 micrometers.

4. The method of claim 1, wherein the conductive bumps have a height in a range from 80 micrometers to about 120 micrometers.

5. The method of claim 1, wherein the conductive bumps have a height in a range from 95 micrometers to about 110 micrometers.

6. The method of claim 1, wherein forming conductive bumps further comprises:
   depositing a first thin conductive layer on the die; and
   depositing the mask material layer on the first thin conductive layer.

7. The method of claim 6, further comprising depositing a protection layer on the second conductive layer.

8. The method of claim 7, further comprising depositing a barrier layer between the protection layer and second conductive layer.

9. The method of claim 7, wherein bonding the conductive bumps to the substrate comprises bonding the conductive bumps to the substrate with a fluxless soldering process.

10. The method of claim 7, wherein the protection layer comprises at least one of Au, Pt, Pd, Ag, Ir, Os, Ru, and Rh.

11. The method of claim 6, wherein the first conductive layer comprises at least one of Ti, TiN, Cr, Ta, Ni, NiV, Co, Cu, Au, and Ag.

12. The method of claim 1, wherein the conductive bumps are formed on a plurality of dies that are part of a wafer.

13. The method of claim 12, further comprising singulating the die from the wafer after forming the conductive bumps.

14. The method of claim 1, wherein the conductive bumps are bonded to the substrate at a bonding temperature and the conductive bumps have a melting point higher than the bonding temperature.

15. The method of claim 14, wherein the bonding temperature is at least a melting point of a solder material that bonds the conductive bumps to the substrate.

16. The method of claim 15, wherein the bonding temperature is about 230 degrees Celsius.

17. The method of claim 1, wherein the second conductive layer comprises at least one of Cu, Ni, Co, Fe, Au, and Ag.

18. The method of claim 1, wherein the mask material layer is patterned after it is deposited.

19. The method of claim 1, wherein the pad openings in the mask material layer have side walls and wherein the second conductive layer contacts the side walls immediately prior to removal of the mask material.

20. The method of claim 1, wherein the second conductive layer is not reflowed after depositing the second conductive layer in the pad openings.

21. The method of claim 1, wherein the mask material layer has a top surface and the second conductive layer has a top surface that does not extend above the top surface of the mask material layer immediately prior to removal of the mask material.

22. A method, comprising:
   forming a plurality of conductive bumps on a surface of a die, wherein forming the conductive bumps comprises:
      depositing a first thin conductive layer on the die;
      depositing an unpatterned layer of mask material on the first thin conductive layer;
      patterning the layer of mask material to form a plurality of trenches through the mask material to the first thin conductive layer;
      depositing a second conductive layer in the trenches;
      removing substantially all the mask material after depositing the second conductive layer; and
      removing substantially all of the first thin conductive layer except for portions of the first thin conductive layer beneath the second conductive layer; and
   bonding the conductive bumps to a substrate with a waveguide between the substrate and the die, wherein the waveguide is not located within a trench in the surface of the substrate.

23. The method of claim 22, wherein the conductive bumps have a height greater than a height of the waveguide.

24. The method of claim 23, wherein the height of the waveguide is in a range of about 95 micrometers to about 110 micrometers.

25. The method of claim 22, wherein bonding the conductive bumps to the substrate comprises positioning the conductive bumps adjacent solder pads on the substrate and reflow soldering the solder pads to bond the conductive bumps to the substrate, wherein the conductive bumps are reflow soldered to the substrate at a bonding temperature and the conductive bumps have a melting point higher than the bonding temperature.

26. The method of claim 22, wherein the second conductive layer has a thickness between about 70 micrometers and about 120 micometers.

* * * * *